United States Patent [19]

Clark et al.

[11] Patent Number: 4,920,285

[45] Date of Patent: Apr. 24, 1990

[54] GALLIUM ARSENIDE ANTENNA SWITCH

[75] Inventors: Edward T. Clark, Plantation; Enrique Ferrer, Miami, both of Fla.

[73] Assignee: Motorola, Inc., Schaumburg, Ill.

[21] Appl. No.: 274,167

[22] Filed: Nov. 21, 1988

[51] Int. Cl.$^5$ .................... H03K 17/687; G06G 7/28; H02J 17/00

[52] U.S. Cl. .................................. 307/571; 307/555; 307/242; 307/146; 307/112

[58] Field of Search ............... 307/242, 571, 271, 555, 307/556, 570, 572; 328/156, 137; 333/103, 262

[56] References Cited

U.S. PATENT DOCUMENTS 4,656,364 4/1987 Yokogawa et al. ................. 307/103

4,808,938 2/1989 Levinson .............................. 307/556

Primary Examiner—Stanley D. Miller
Assistant Examiner—Terry Cunningham
Attorney, Agent, or Firm—Thomas G. Berry

[57] ABSTRACT

An RF signal is transformed (12 and 12') to increase its current component, while reducing its voltage component below the voltage that would damage a GaAs switching device (16 or 16'). The current and voltage transformation are selected so that the power of the RF signal remains substantially constant. Subsequent to the GaAs switching device, the signal is converted (24 and 24') to increase the voltage component while decreasing its current component to substantially recreate the original RF signal.

12 Claims, 1 Drawing Sheet

GALLIUM ARSENIDE ANTENNA SWITCH

TECHNICAL FIELD

This invention relates generally to electronic switches, and more particularly, to a Gallium Arsenide (GaAs) field effect transistor switch suitable for switching radio frequency (RF) signals.

BACKGROUND OF THE INVENTION

The use of GaAs transistors in electronic switches is known. Generally, GaAs transistors are preferred over PIN diodes because they may be readily integrated onto a monolithic integrated circuit, and because they dissipate negligible power in the ON state. Additionally, GaAs transistors are preferred over other field effect transistors because of their high frequency operating characteristics.

Nevertheless, the use of GaAs transistors often becomes impractical or impossible due to several inherent detriments. One such detriment stems from the realization that GaAs field effect transistors are depletion mode devices, which require a negative bias voltage (for an N-channel device) between the gate and source terminals to switch the transistor to the OFF state. Thus, an additional power supply is required to operate the switch. Secondly, currently available GaAs transistors have a drain-to-source breakdown voltage of approximately 18 Volts. Exceeding this breakdown voltage causes irreversible damage. Consequently, GaAs transistors may only be used to switch signals up to approximately three (3) Watts (assuming a fifty (50) Ohm load) without damaging or destroying the switch.

The GaAs switch described below, however, not only permits the switching of higher power signals, but also eliminates the need for an additional bias voltage supply by deriving the necessary bias voltage directly from the input signal to the switch.

SUMMARY OF THE INVENTION

Briefly, according to the invention, an RF signal having a voltage component and a current component is processed to reduce the voltage component, while contemporaneously increasing the current component so that the power of the RF signal remains substantially constant. This processed RF signal may be switched without damaging a GaAs switching device since the voltage component of the processed RF signal has been reduced. Subsequent to the switching device, the processed RF signal is converted to increase the voltage component, while contemporaneously decreasing its current component to substantially recreate the original RF signal.

In another aspect of the present invention, the RF signal is inherently filtered due to the preferred structure of the present invention, thereby eliminating the need for subsequent filtering after the switch.

BRIEF DESCRIPTION OF THE DRAWING

The drawing FIGURE is a schematic diagram of the preferred embodiment of the present invention.

DESCRIPTION OF THE PREFERRED EMBODIMENT

Figure 1:
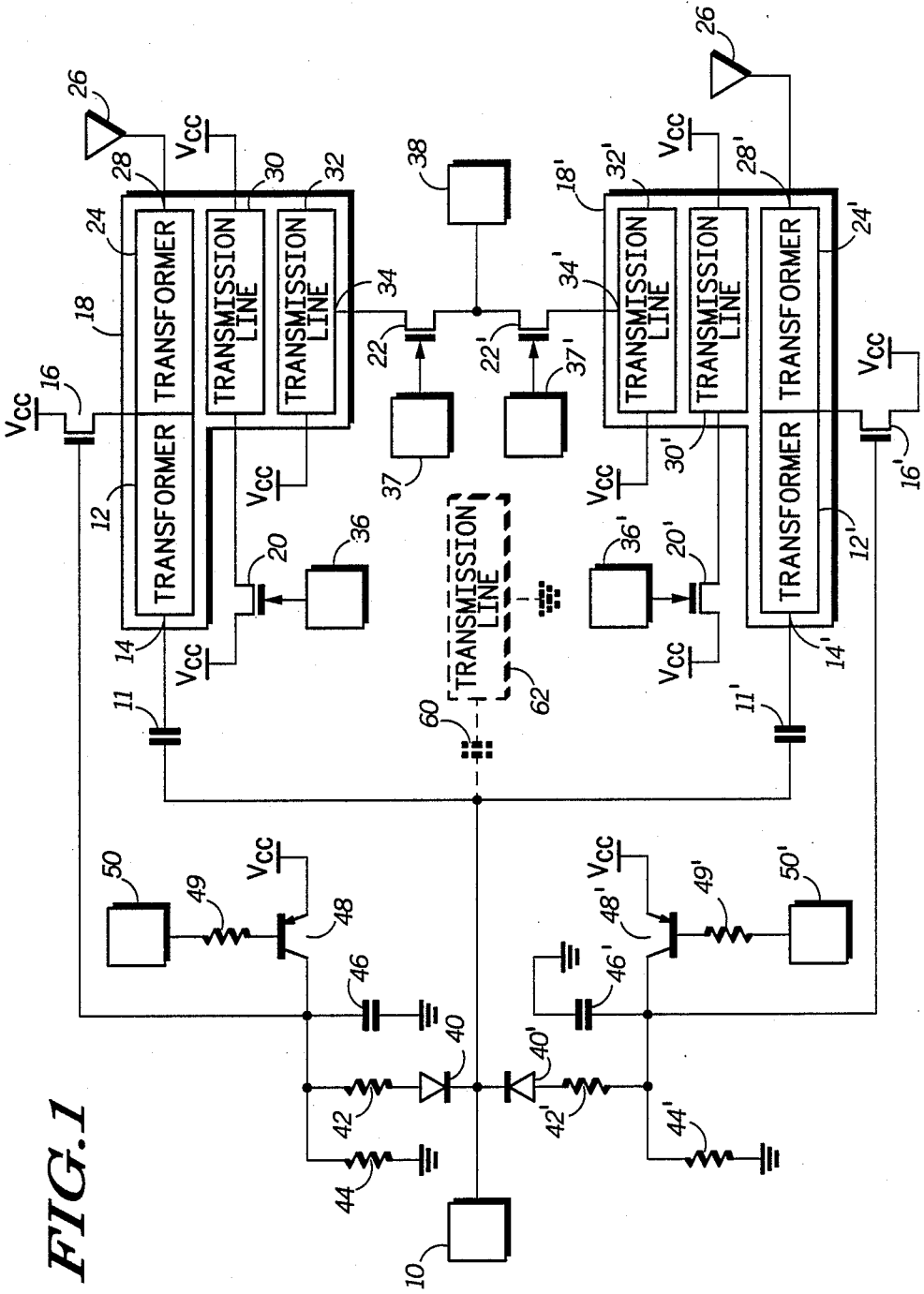

Referring to the drawing FIGURE, a schematic diagram of the present invention is illustrated. According to the invention, an RF signal is received at a terminal 10 from a driving device (not shown), which preferably comprises an RF power amplifier. As is known, any RF signal comprises a voltage component and a current component, the mathematical product of which represents the power of the RF signal.

The RF signal received at the terminal 10 is processed by applying it to a first transformer 12 having an input and an output port (the input port 14 being connected to the terminal 10 via a capacitor 11, the value of which is selected to provide a substantial short at the frequency of the RF signal). The impedance of the input port 14 should be higher than the impedance of the output port. In an exemplary embodiment of the invention, the impedance of the input port 14 is fifty (50) Ohms, while the impedance of the output port is 6.25 Ohms. In general, the impedance of the input port 14 is selected to match the output impedance of the driving device (not shown) connected to the terminal 10. The ratio of the input to output port impedances is selected so that the voltage component of the RF signal at the output port of the transformer 12 is sufficiently reduced so that the breakdown voltage of a switching device 16 is not exceeded. Although the voltage component of the RF signal is reduced, the current component at the output port of the transformer 12 will be proportionally increased, such that, the input and output power is substantially identical, less some small insertion loss.

The transformer 12 is preferably a ¼ wavelength transmission line device, such as, a well known strip-line or micro-strip device. To provide the proper input and output impedances, the physical parameters of the transmission line, such as, the width of the transmission line, and the height or dielectric constant of a substrate 18, may be selected according to well known design rules. Although a transmission line device is preferred at higher frequencies, other well known devices for transforming impedance may be suitable, such as, a well known lumped element impedance transformation circuit.

Transistor 16 comprises a first electronic switch, and is arranged to couple the output of the first transformer 12 to Vcc (i.e., a DC voltage potential). Those skilled in the art will appreciate that a DC voltage potential represents a ground to an AC signal, such as an RF signal. Thus, when activated, the transistor 16 shorts the output of the transformer 12 to AC ground. This prevents the received RF signal from progressing further. The transistors 16, as well as transistors 20 and 22, described below, are preferably Gallium Arsenide (GaAs) field effect transistors. Other well known devices may also be suitable, such as bipolar transistors, field effect transistors constructed from a technology other than GaAs, or even mechanical relays.

The transistor 16 is also coupled to the input port of a second transformer 24, which has an output port 28 coupled to an antenna 26. The impedance at the input port (the port connected to the output port of the transformer 12) should be lower than the impedances of the output port 28, and, ideally, the impedance at the input port should match the impedance of the output port of the transformer 12. In an exemplary embodiment of the invention, the impedance at the output port 28 is fifty (50) Ohms, while the impedance at the input port is 6.25 Ohms.

The transformer 24 is preferably positioned in parallel with two other transmission lines (30 and 32), such that an interdigitated transmission line device is formed. As is known, the conductors of an interdigitated transmission line are mutually electromagnetically coupled. Thus, a signal applied to the transformer 24 wil be magnetically transferred first to the transmission line 30, and from there to the transmission line 32. The transmission line 32 has an output port 34 selected for convenience at its midpoint. To set the impedance of the output port 34 of the transmission line 32, the physical parameters of the transmission line 32 may be selected according to well known design rules, such as by selecting a particular width, or varying the height or dielectric constant of the substrate 18, or by selecting a particular spacing of the various transmission lines 30 and 32 and the transformer 24.

A transistor 20 comprises a second electronic switch. The source terminal of transistor 20 is connected to an AC ground (i.e., Vcc), while the drain is coupled to one side of the transmission line 30. The gate terminal of the transistor 20 is connected to a control terminal 36. It should be noted that the Drawing FIGURE assumes that the field effect transistors are bidirectional devices, such that it is entirely arbitrary as to which end of the transistor is referred to as the source and which end the drain. When activated, the transistor 20 couples one side of the transmission line 30 to AC ground (i.e., Vcc). This provides substantial isolation to any signal, and reduces electro-magnetic coupling to the transmission line 32, since the other side of the transmission line 30 is directly coupled to Vcc (i.e., AC ground). Thus, with both sides effectively grounded, the transmission line 30 substantially reduces further electro-magnetic signal coupling.

A transistor 22 comprises a third electronic switch. This switch is disposed between the output port 34 of the transmission line 32 and a terminal 38, which, according to the present invention, is coupled to a receiver (not shown). The gate terminal of the transistor 22 is coupled to a control terminal 37. When activated, the transistor 22 (or 22') couples the output of the transmission line 32 (or 32') to the terminal 38, which preferably is coupled to an RF receiver. When switched OFF, the transistor 22 (or 22') isolates the terminal 38 from any signals at the output port 34 (or 34') of the transmission line 32 (or 32').

To eliminate the need for a second power supply, the present invention derives a negative voltage potential from the RF signal received at the terminal 10. This is accomplished via a half-wave rectifier and filter circuit comprising a diode 40, resistors 42 and 44, and a capacitor 46. This provides a negative DC voltage potential at the collector of a transistor 48. More particularly, the resistors 42 and 44 form a voltage divider circuit that reduces the voltage at the anode of diode 40. The values of resistors 42 and 44 depend upon the maximum voltage at the terminal 10, and are selected such that the voltage at the gate of the transistor 16 is sufficient to "pinch-off" the transistor, but does not exceed the gate-to-source breakdown voltage of the transistor 16. Capacitor 46 comprises a filter capacitor, and its value will depend upon the intended operating frequency of the invention. Preferably, the diode 40 is a Schottky diode, although other diodes may be suitable. Additionally, although a half-wave rectifier circuit is illustrated, other well known AC-DC converter circuits may also be employed, such as, for example, a full wave rectifier circuit or its functional equivalent.

As shown in the Drawing FIGURE, the invention is preferably embodied as two complementary sections so that the RF signal received at the input terminal 10 may be routed to either antenna 26 or 26', and any signals received by either antenna 26 or 26' may be routed to the terminal 38. The symmetrical construction of the present invention facilitates a realization of the present invention as a monolithic integrated circuit. These symmetrical elements (i.e., the prime reference numerals) are substantially identical to, and function in the same manner as, elements described above.

The preferred application of the invention is as an antenna switch for a radio transceiver, although the invention may be used to switch any AC signal. The Drawing FIGURE illustrates the preferred application wherein the terminal 10 is connected to the output of an RF power amplifier stage of a radio transmitter, and the terminal 38 is connected to the RF input of a radio receiver. Using the present invention, any signal may be transmitted via either antenna 26 or 26', and any signal received by either antenna 26 or 26' may be routed to the RF input of a radio receiver.

OPERATION

To switch the depletion mode field effect transistors 16, 20, and 22 (and 16', 20' and 22') OFF, a negative gate-to-source voltage is required. The preferred embodiment of the invention assumes that the peak-to-peak input voltage swing at terminal 10 is sufficiently large such that, simply bringing the gate voltage of transistor 16 (or 16') to ground potential is insufficient to shut the transistor OFF throughout the entire cycle of the input signal. Consequently, the rectifier circuits (i.e., the diodes 40 and 40'; the resistors 42, 42', 44, and 44'; and the capacitors 46 and 46') provide a sufficient negative voltage to turn transistors 16 (and 16') OFF. This negative voltage is coupled to the gate of transistor 16 when transistor 48 is switched OFF, and to the gate of transistor 16' when transistor 48' is OFF.

To switch transistor 48 ON, the control terminal 50 is grounded, thereby causing current to flow through the base-emitter junction of transistor 48 (the base-emitter current is limited by a biasing resistor 49). Connecting the control terminal 50 to Vcc will turn the transistor 48 OFF by interrupting the base-emitter current flow. To switch transistor 48 OFF, terminal 50 is connected to Vcc. Similarly, transistor 48' is switched ON by grounding terminal 50', and OFF by connecting terminal 50' to Vcc. Accordingly, transistor 16 is switched ON when terminal 50 is grounded, and OFF when terminal 50 is coupled to Vcc. Similarly, Transistor 16' is switched ON when terminal 50' is grounded, and OFF when terminal 50' is connected to Vcc.

To switch transistors 20 (or 20') ON, Vcc is applied to the control terminal 36 (or 36'). Similarly, the transistors 22 (or 22') are switched ON by applying Vcc to the control terminal 37 (or 37'). Grounding these control terminals switches their associated transistors OFF.

To transmit using antenna 26, transistors 16', 20, and 20' are switched ON, while transistors 16, 22, and 22' are switched OFF. The signal at terminal 10 is transformed by transformer 12 into a corresponding signal that has a lower voltage component and a higher current component. This transformed signal is coupled to the input port of transformer 24 since transistor 16 is OFF. The signal is converted via the transformer 24 into a signal having a higher voltage component and a lower current component, such that the resulting signal is preferably substantially identical to the original signal received at the terminal 10. Usually, transformers 12 and 24 perform equal, but opposite, impedance transformations, such that, ideally, the signal presented to the antenna 26 is identical to the signal at terminal 10.

Since the transistor 20 is switched ON, the transmission line 30 becomes an AC ground barrier to reduce the electromagnetic coupling of the signal to the transmission line 32. However, should some portion of the signal couple into the transmission line 32, transistor 22 is switched OFF, which isolates (or decouples) the signal from the terminal 38.

As can be seen from the Drawing FIGURE, any signal received from the terminal 10 and routed to the transformer 12 will also be presented to the transformer 12'. However, since the transistor 16' is ON, the signal may only proceed through the ¼ wavelength of transformer 12' to ground. It will be appreciated, however, that the transformer 12' appears to be ½ wavelength in length to the second harmonic of the signal at terminal 10. As is known, a ½ wavelength transmission line represents a short, and in the configuration of the present invention, the second harmonic of the signal to be transmitted via antenna 26 will be shorted to AC ground thereby filtering the transmitted signal. This eliminates the requirement for filtering between the output port 28 of the transformer 24 and the antenna 26. Alternately, if the symmetrical structure of the present invention is not desirable, the same results may be achieved by connecting a decoupled (60) ½ wavelength (to the second harmonic) transmission line 62 to the terminal 10. The present invention operates in a similar manner to transmit using antenna 26'. To do this, however, transistors 16, 20, and 20' are switched ON, while transistors 16', 22, and 22' are switched OFF.

To receive using antenna 26, transistors 16, 16', 20' and 22 are switched ON, while transistors 20 and 22' are switched OFF. A signal picked up by antenna 26 is electro-magnetically coupled through transformer 24 and transmission line 30 to transmission line 32. From the output port 34 of the transmission line 32, a received signal passes through the activated transistor 22 to the terminal 38. While receiving from antenna 26, any signals received by the antenna 26' are prevented from reaching the terminal 38 due to the ground provided by the activated transistor 20', and the isolation provided by transistor 22' which is OFF. Conversely, to receive using antenna 26', transistors 16, 16', 20, and 22' are switched ON, while transistors 20' and 22 are switched OFF.

What is claimed is:

1. A method of switching a radio frequency signal being capable of representation by a voltage component and a current component the product of which approximates a signal power, said method comprising the steps of:
   (a) processing the radio frequency signal to provide a processed signal by decreasing said voltage component and increasing said current component, such that the signal power of said processed signal remains substantially identical to said radio frequency signal; and,
   (b) coupling said processed signal to a radio frequency ground when switching the radio frequency signal to the radio frequency ground, and converting said processed signal to provide an output signal by increasing said voltage component and decreasing said current component, such that said output signal is substantially identical to said radio frequency signal, when switching the radio frequency signal to an output port.

2. The method of claim 1, which includes the step of filtering said radio frequency signal prior to said processing step.

3. The method of claim 1, wherein step (a) comprises processing the radio frequency signal to provide a processed signal by decreasing said voltage component below 18 volts, and increasing said current component, such that the signal power of said processed signal remains substantially identical to said radio frequency signal.

4. The method of claim 1, wherein step (b) comprises activating a gallium arsenide transistor when switching said processed signal to the radio frequency ground, and deactivating the gallium arsenide transistor when switching the radio frequency signal to the output port.

5. A method of switching a radio frequency signal being capable of representation by a voltage component and a current component the product of which approximates a signal power, said method comprising the steps of:
   (a) transforming the radio frequency signal to provide a transformed signal by decreasing said voltage component below a breakdown voltage of a gallium arsenide transistor, and increasing said current component, such that the signal power of said transformed signal remains substantially identical to said radio frequency signal; and,
   (b) activating said gallium arsenide transistor when switching said radio frequency signal to a radio frequency ground, and converting said transformed signal to provide an output signal by increasing said voltage component and decreasing said current component, such that said output signal is substantially identical to said radio frequency signal, when switching the transformed signal to an output port.

6. A method of switching a radio frequency signal being capable of representation by a voltage component and a current component the product of which approximates a signal power, said method comprising the steps of:
   (a) transforming the radio frequency signal to provide a transformed signal by decreasing said voltage component below 18 volts, and increasing said current component, such that the signal power of said transformed signal remains substantially identical to said radio frequency signal; and,
   (b) activating a gallium arsenide transistor when switching said radio frequency signal to a radio frequency ground, and converting said transformed signal to provide an output signal by increasing said voltage component and decreasing said current component, such that said output signal is substantially identical to said radio frequency signal, when switching the radio frequency signal to an output port.

7. A switch for switching a radio frequency signal being capable of representation by a voltage component and a current component the product of which approximates a signal power, said switch comprising:
   processing means for processing the radio frequency signal to provide a processed signal by decreasing said voltage component and increasing said current component, such that the signal power of said processed signal remains substantially identical to said radio frequency signal; and, coupling means for coupling said processed signal to a radio frequency ground when said coupling means is activated and converting means for converting said processed signal to provide an output signal by increasing said voltage component and decreasing said current component, such that said output signal is substantially identical to said radio frequency signal, when said coupling means is deactivated.

8. A switch, comprising:

first transforming means for transforming impedance, said first transforming means having an input port and an output port each having an impedance associated therewith, said impedance of said output port being lower than said impedance of said input port;

second transforming means for transforming impedance, said second transforming means having an input port coupled to said output port of said first transforming means, and an output port each having an impedance associated therewith, said impedance of said input port being lower than said impedance of said output port; and, coupling means for selectively coupling said output port of said first impedance transforming means and said input port of said second transforming means to ground potential.

9. The switch of claim 8, wherein said coupling means comprises a gallium arsenide transistor.

10. The switch of claim 8, which includes at least one transmission line electromagnetically coupled to said second impedance transforming means.

11. The switch of claim 8, which includes a filter means coupled to said input port of said first impedance transforming means.

12. A switch, comprising:

first transforming means for transforming impedance, said first transforming means having an input port and an output port each having an impedance associated therewith, said impedance of said output port being lower than said impedance of said input port;

second transforming means for transforming impedance, said second transforming means having an input port coupled to said output port of said first transforming means, and an output port each having an impedance associated therewith, said impedance of said input port being substantially identical to said impedance of said output port of said first impedance transforming means, and said impedance of said output port being substantially identical to said impedance of said input port of said first impedance transforming means; and, coupling means for selectively coupling said output port of said first impedance transforming means and said input port of said second transforming means to ground potential.

* * * * *